(12) United States Patent
Kim et al.

(10) Patent No.: US 11,791,187 B2
(45) Date of Patent: Oct. 17, 2023

(54) MARK PRINTING DEVICE AND METHOD OF PRINTING MARK USING THE SAME

(71) Applicant: SEMES CO., LTD., Cheonan-si (KR)

(72) Inventors: Gon Kim, Seoul (KR); Dong Hwan Kim, Incheon (KR); Sang Hoon Baek, Seongnam-si (KR); Jung Wan Hong, Hwaseong-si (KR); Young In Kim, Jeollanam-do (KR)

(73) Assignee: SEMES CO., LTD., Cheonan-si (KR)

( * ) Notice: Subject to any disclaimer, the term of this patent is extended or adjusted under 35 U.S.C. 154(b) by 219 days.

(21) Appl. No.: 17/082,777

(22) Filed: Oct. 28, 2020

(65) Prior Publication Data
US 2021/0134633 A1 May 6, 2021

(30) Foreign Application Priority Data
Oct. 31, 2019 (KR) .................... 10-2019-0137274

(51) Int. Cl.
*H01L 21/67* (2006.01)
*H01L 21/677* (2006.01)
*B41J 2/01* (2006.01)
*B41J 2/44* (2006.01)
*G06F 3/12* (2006.01)
*B41J 3/407* (2006.01)
*B41J 2/045* (2006.01)
(Continued)

(52) U.S. Cl.
CPC .......... *H01L 21/67733* (2013.01); *B41J 2/01* (2013.01); *B41J 2/04541* (2013.01); *B41J 2/04586* (2013.01); *B41J 2/442* (2013.01); *B41J 3/4073* (2013.01); *B41J 23/02* (2013.01); *B41J 29/393* (2013.01); *G06F 3/1285* (2013.01); *H01L 21/67* (2013.01); *H01L 21/67259* (2013.01); *H01L 21/67282* (2013.01); *H01L 21/67706* (2013.01); *H01L 21/67724* (2013.01)

(58) Field of Classification Search
CPC ......... H01L 21/67282; H01L 21/67259; H01L 21/67706; H01L 21/67724; H01L 21/67733; B41J 2/04541; B41J 2/04586; B41J 2/442; B41J 23/02; B41J 29/393; B41J 3/28; G06F 3/1285
See application file for complete search history.

(56) References Cited

FOREIGN PATENT DOCUMENTS

| CN | 105460328 A | * | 4/2016 |
| JP | 2006331054 A | * | 12/2006 |

* cited by examiner

*Primary Examiner* — Justin Seo
*Assistant Examiner* — Kendrick X Liu
(74) *Attorney, Agent, or Firm* — KILE PARK REED & HOUTTEMAN PLLC

(57) ABSTRACT

A mark printing device includes a driving unit driving along a driving rail of an overhead hoist transport, a printing unit being configured to print on the driving rail a mark for guiding a motion of a vehicle, a data processing unit receiving design data including design information of the driving rail and first information on a position and type of the mark from a server, an encoder unit being configured to calculate a rotation amount of a servo motor provided in the driving unit to detect a current position of the driving unit and a driving distance of the driving unit, and a control unit being configured to control the driving unit and the printing unit to print the mark on the driving rail by using the design data and second information on the current position and the driving distance of the driving unit.

9 Claims, 6 Drawing Sheets

(51) Int. Cl.
*B41J 23/02* (2006.01)
*B41J 29/393* (2006.01)

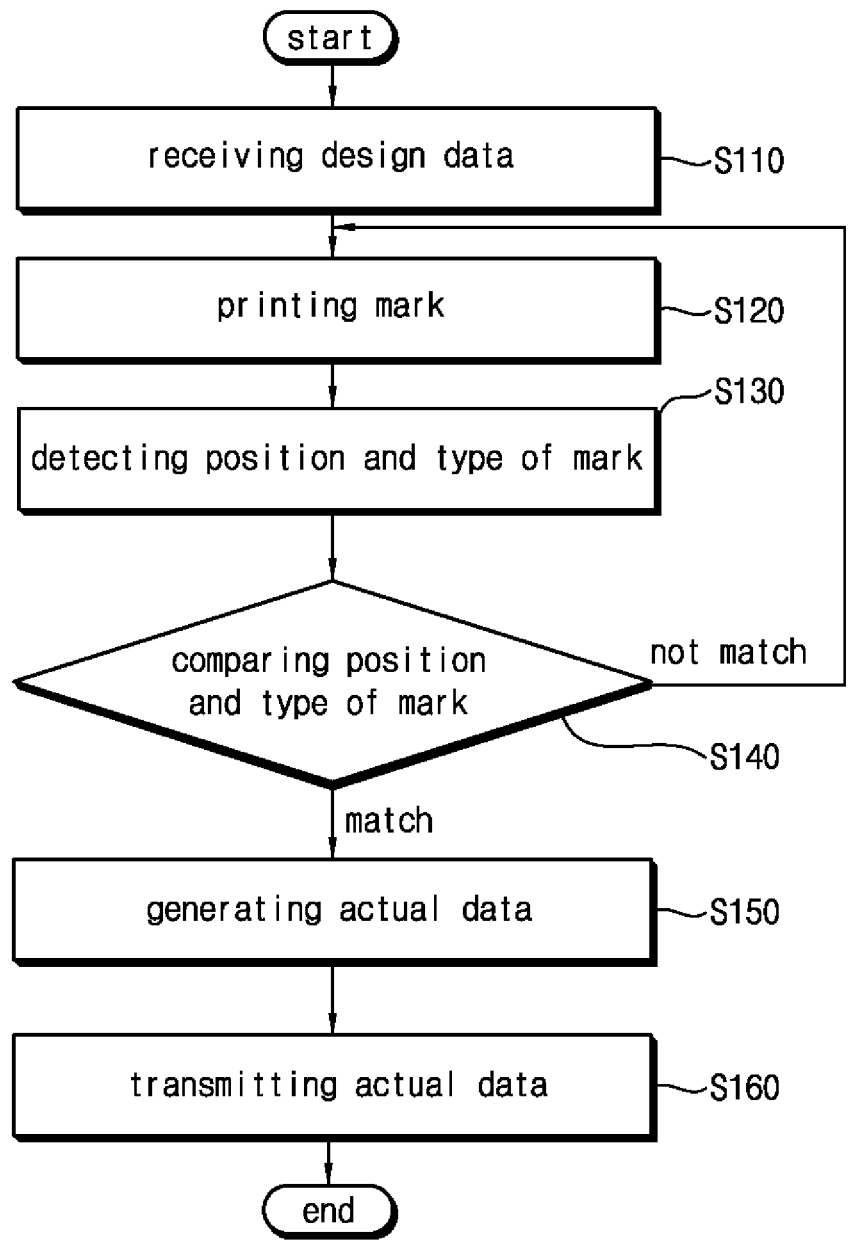

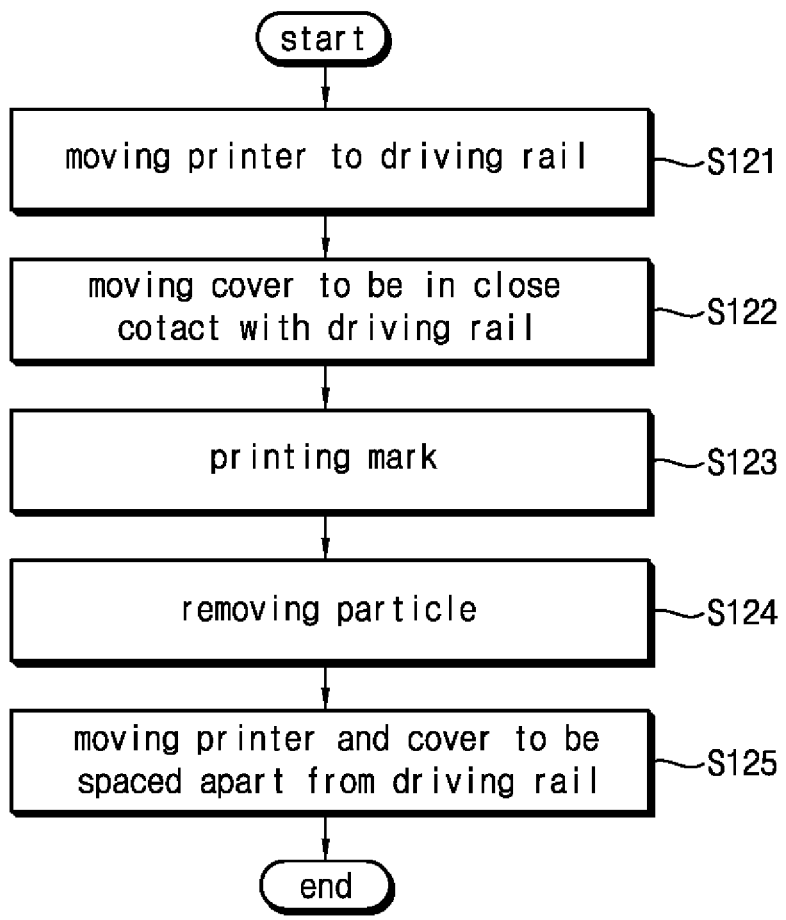

MARK PRINTING DEVICE AND METHOD OF PRINTING MARK USING THE SAME

CROSS-REFERENCE TO RELATED APPLICATION

This application claims the priority benefit of Korean Patent Application No. 10-2019-0137274, filed on Oct. 31, 2019, and all the benefits accruing therefrom under 35 U.S.C. § 119, the contents of which are incorporated by reference in their entirety.

BACKGROUND

The present disclosure relates to a mark printing device and method of printing a mark using the same, and more particularly, to a mark printing device for printing a mark on a driving rail of an overhead hoist transport in order to guide a motion of a vehicle, and method of printing a mark using the same.

In general, semiconductor processing equipments for manufacturing a semiconductor device are generally disposed in succession to perform various processes on a semiconductor substrate. A plurality of process for manufacturing the semiconductor device is performed on an object, and the object is accommodated in a cassette and provided to each of the semiconductor processing equipment or recovered from each of the semiconductor processing equipment.

The cassette is transferred by the overhead hoist transport. The overhead hoist transport includes a driving rail provided along a ceiling of a space in which the semiconductor processing equipments are installed, and a vehicle being configured to grip the cassette and to drive along the driving rail.

A mark for engraving information about a driving and a stopping status of the vehicle and a loading and an unloading status of the cassette is printed on the driving rail, and the vehicle may drive along the driving rail while detecting the mark.

According to the prior art, the mark is printed manually on the driving rail using a rolling tower. In order to work using the rolling tower, a large number of personnel such as personnel for moving the rolling tower and a personnel for working on the rolling tower, are required, and a lot of work time may be required.

In addition, since the mark is printed manually, an accuracy of the mark printing operation may be poor.

In addition, when the vehicle malfunctions, a safety accident may occur for worker in the rolling tower.

SUMMARY

The present invention provides a mark printing device capable of automatically printing a mark on a driving rail of an overhead hoist transport.

The present invention provides a mark printing method using the mark printing device.

In accordance with an aspect of the present disclosure, a mark printing device may include a driving unit driving along a driving rail of an overhead hoist transport, a printing unit mounted on the driving unit, the printing unit being configured to print on the driving rail a mark for guiding a motion of a vehicle of driving along the driving rail, a data processing unit receiving design data including design information of the driving rail and first information on a position and type of the mark to be printed on the driving rail from a server, an encoder unit being configured to calculate a rotation amount of a servo motor provided in the driving unit to detect a current position of the driving unit and a driving distance of the driving unit in the driving rail, and a control unit being configured to control the driving unit and the printing unit to print the mark on the driving rail by using the design data and second information on the current position and the driving distance of the driving unit.

In accordance with some exemplary embodiments of the present disclosure, the printing unit may include a printer being configured to print the mark on the driving rail, and a motor being configured to move the printer so that the printer is adjacent to or spaced apart from the driving rail.

In accordance with some exemplary embodiments of the present disclosure, the printing unit may further include a cover accommodating the printer and in contact with a printing surface on which the mark is printed on the driving rail to suppress particles from scattering when the printer prints the mark, and the motor further moves the cover so that the cover is in contact with or spaced apart from the driving rail.

In accordance with some exemplary embodiments of the present disclosure, the printing unit may further include a pump mounted on the cover, the pump circulating air inside the cover through a passage passing through the cover, and a filter disposed on the passage and collecting the particles contained in the air.

In accordance with some exemplary embodiments of the present disclosure, the cover includes a portion in contact with the printing surface of the driving rail, the portion of the cover being made of an elastic material.

In accordance with some exemplary embodiments of the present disclosure, the mark printing device may include a sensor unit detects a position and type of the mark printed on the driving rail by the printing unit.

In accordance with some exemplary embodiments of the present disclosure, the data processing unit may compare the position and type of the mark to be printed with the position and type of the printed mark, and when a comparison result matches, actual data on the driving rail, and the position and type of the print mark may be generated.

In accordance with some exemplary embodiments of the present disclosure, the data processing unit may transmit the actual data to the server to merge the actual data with other actual data.

In accordance with some exemplary embodiments of the present disclosure, when the comparison result does not match, the control unit may control the driving unit and the printing unit to re-print the mark.

In accordance with some exemplary embodiments of the present disclosure, the type of the mark may include a driving mark, a stopping mark, and a loading/unloading mark.

In accordance with an aspect of the present disclosure, a method of printing a mark may include receiving design data including design information of the driving rail and first information on a position and type of a mark to be printed on the driving rail from a server, printing the mark on the driving rail by using the design data and second information on a current position and a driving distance of a driving unit driving along the driving rail, detecting a position and type of the mark printed on the driving rail, comparing the position and type of the mark to be printed with the position and type of the printed mark, and generating actual data on the driving rail, and the position and type of the print mark when a comparison result matches.

In accordance with some exemplary embodiments of the present disclosure, the method may include transmitting the actual data to the server to merge the actual data with other actual data.

In accordance with an aspect of the present disclosure, wherein when the comparison result does not match, printing the mark, detecting a position and type of the mark printed on the driving rail, and comparing the position and type of the mark to be printed with the position and type of the printed mark may be repeated until the comparison result matches.

In accordance with an aspect of the present disclosure, wherein the second information on the current position and the driving distance of a driving unit may be obtained by detecting a rotation amount of a servo motor provided in the driving unit by the encoder unit.

In accordance with an aspect of the present disclosure, wherein printing the mark on the driving rail may include moving a printer for printing the mark to be adjacent to the driving rail, moving a cover to accommodate the printer and to be in close contact with a printing surface on which the mark is printed on the driving rail, printing the mark on the printing surface of the driving rail, removing particles generated when the printer prints the mark from an inside of the cover, and moving the printer and the cover to be spaced apart from the driving rail.

In accordance with an aspect of the present disclosure, wherein removing the particles may include circulating air inside the cover through a passage passing through the cover using a pump disposed outside the cover, and collecting the particles contained in the air using a filter disposed on the passage.

In accordance with the exemplary embodiments of the present invention, the mark printing device and method of printing mark using the same automatically print the mark on the driving rail while driving along the driving rail. Therefore, an operation of printing the mark may be performed quickly.

In addition, since an additional person is not required for the operation of printing the mark, human efforts may be saved, and safety accidents may be reduced.

Further, since the current position of the driving unit at the driving rail and the driving distance of the driving unit are detected using the encoder unit, the mark may be printed at an accurate position. Particularly, since the position and type of the mark printed on the driving rail by the printing unit are detected by the sensor unit, an accuracy of the print position and type of the mark may be further improved.

Meanwhile, scattering of the particles may be suppressed, and the particles may be collected by using the cover, the pump, and the filter. Accordingly, it is possible to reduce contamination of the space in which the overhead hoist transport is provided by the particles.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which:

FIG. 5 is a flowchart illustrating a method of printing a mark using the mark printing device shown in FIG. 1; and FIG. 6 is a flowchart illustrating printing mark shown in FIG. 5.

DETAILED DESCRIPTION

Figure 1:
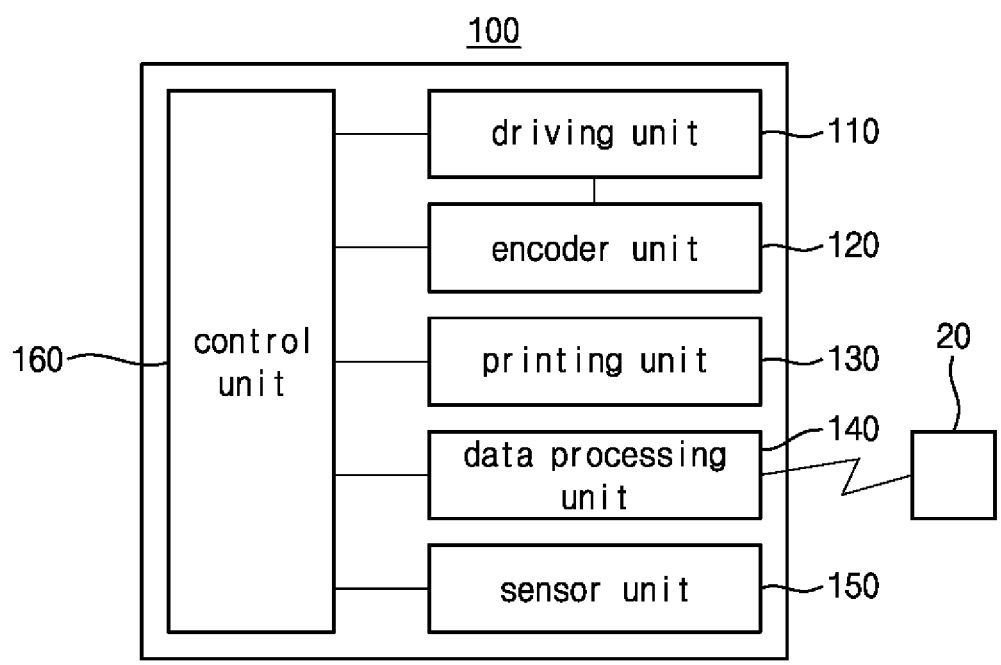
FIG. 1 is a schematic block diagram illustrating a mark printing device In accordance with an exemplary embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

Hereinafter, specific embodiments on a stocker will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout. In the figures, the dimensions of layers and regions are exaggerated for clarity of illustration.

The terms such as first, second, etc., can be used in describing various elements, but the above elements by the above terms should not be limited. The above terms are one element from the other used only to distinguish. For example, in the present invention without departing from the scope of the first component to the second component may be named similarly, the second component to the first component also can be named.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
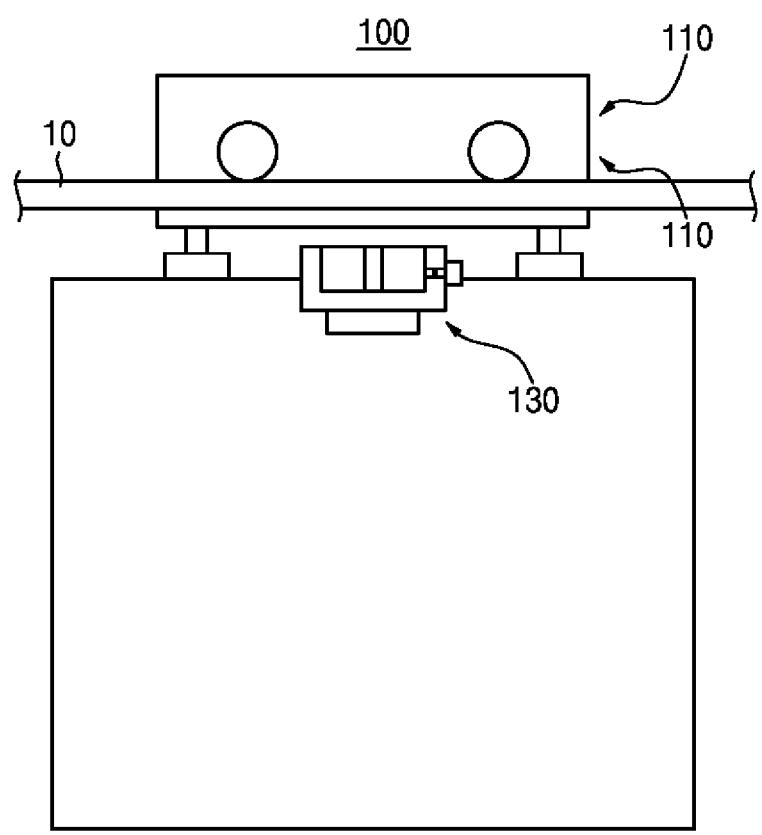
FIG. 2 is a schematic side view illustrating the mark printing device shown in FIG. 1.
Figure 3:
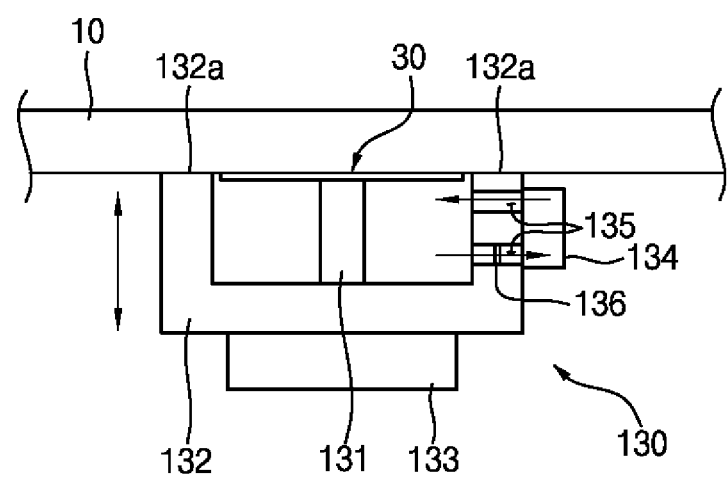
FIG. 3 is a schematic side view illustrating a printing unit shown in FIG. 1.
Figure 4:
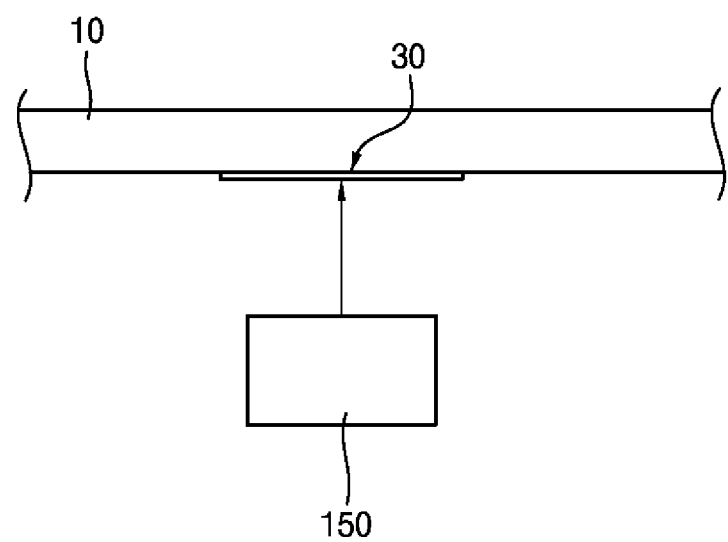
FIG. 4 is a schematic side view illustrating a sensor unit shown in FIG. 1.

FIG. 1 is a schematic block diagram illustrating a mark printing device In accordance with an exemplary embodiment of the present invention, FIG. 2 is a schematic side view illustrating the mark printing device shown in FIG. 1, FIG. 3 is a schematic side view illustrating a printing unit shown in FIG. 1, and FIG. 4 is a schematic side view illustrating a sensor unit shown in FIG. 1.

Referring to FIGS. 1 to 4, the mark printing device 100 prints a mark 30 on a driving rail 10 on which a vehicle (not shown in detail in figures) drives in an overhead hoist transport (not shown in detail in figures).

A type of the mark 30 includes a driving mark, a stopping mark, and a loading/unloading mark. The vehicle detects the mark 30 while driving along the driving rail 10. Depending on the type of the mark 30, the vehicle may perform any one of a driving motion, a stopping motion, and a loading/unloading motion.

The mark 30 may be represented by a barcode, a QR code, a data matrix, a maxi code, a number, or a symbol.

The mark printing device 100 may include a driving unit 110, an encoder unit 120, a printing unit 130, a data processing unit 140, a sensor unit 150, and a control unit 160.

The driving unit 110 drives along a driving rail 10. Specifically, the driving unit 110 has a servo motor, and driving wheels rotate according to the driving of the servo motor.

The encoder unit 120, the printing unit 130, the data processing unit 140, the sensor unit 150, and the control unit 160 are configured to the driving unit 110, and move along the driving rail 10 with the driving unit 110.

Although not shown in detail in figures, the vehicle may be used as the driving unit 110.

The encoder unit 120 is configured to the servo motor of the driving unit 110. The encoder unit 120 may calculate a rotation amount of the servo motor to detect a current position of the driving unit 110 and a driving distance of the driving unit 110 in the driving rail 10.

The printing unit 130 is mounted on the driving unit 110 and prints the mark 30 on the driving rail 10.

The printing unit 130 may include a printer 131, a cover 132, a motor 133, a pump 134, and a filter 136.

The printer 131 directly prints the mark 30 on the driving rail 10. Examples of the printer 131 include an inkjet printer and a laser printer.

Besides, the printer 131 may print to mask an erroneously printed mark 30 on the transfer rail 10. Accordingly, the erroneously printed mark 30 may be not recognized by the vehicle.

If the mark 30 is erroneously printed, it may be a case that the mark 30 is not printed at the position of the mark to be printed, or a mark 30 of a type different from the type of the mark to be printed may be printed.

The cover 132 has a hollow shape with one side open. The cover 132 may accommodate the printer 131 therein, and be in close contact with a printing surface on which the mark 30 is printed on the driving rail 10 to seal an inside of the cover 132. Accordingly, the cover 132 blocks particles generated when the printer 131 prints the mark 30 from scattering to an outside of the cover 132, so that contamination of a space in which the overhead hoist transport is provided may be suppressed.

A portion 132a of the cover 132 in close contact with the printing surface of the driving rail 10 may be made of an elastic material. Therefore, the inside of the cover 132 may be stably sealed.

The motor 133 moves the printer 131 so that the printer 131 is adjacent to the driving rail 10 to print the mark 30. When printing of the mark 30 is completed, the motor 133 moves the printer 131 so that the printer 131 is spaced apart from the driving rail 10.

In addition, the motor 133 moves the cover 132 so that the cover 132 is in close contact with the printing surface of the driving rail 10, or the cover 132 is spaced apart from the printing surface of the driving rail 10.

In an example embodiment, the motor 133 may simultaneously move the printer 131 and the cover 132. In another example embodiment, the motor 133 may individually move the printer 131 and the cover 132. In this case, the motor 133 may be provided in plural.

The pump 134 is disposed on an outer or inner surface of the cover 132 and circulates air inside the cover 132 through a passage 135 passing through the cover 132.

The pump 134 may operate in a state in which the cover 132 is in close contact with the printing surface of the driving rail 10. The filter 136 is provided on the passage 135 and collects the particles contained in the air.

The particles inside the cover 132 may be collected and removed using the pump 134 and the filter 136. Accordingly, even if the cover 132 is spaced apart from the printing surface of the driving rail 10, the space in which the overhead hoist transport is provided may be prevented from being contaminated by the particles in the inside of the cover 132.

The data processing unit 140 may wirelessly communicate with an external server 20.

The data processing unit 140 may receive design data from the server 20. The design data may include design information of the driving rail 10 when the overhead hoist transport is set up, and first information on a position and type of mark to be printed on the driving rail 10.

The control unit 160 may detect the position and type of a mark to be printed on the driving rail 10 from the design data of the data processing unit 140. In addition, the control unit 160 may be connected to the encoder unit 120 to obtain second information on the current position and the driving distance of the driving unit 110 in real time.

The control unit 160 controls the driving unit 110 and the printing unit 130 to print the mark 30 on the driving rail 110 using the first information on the position and type of the mark to be printed on the driving rail 10, and the second information on the current position and driving distance of the driving unit 110.

In an example embodiment, when the driving unit 110 reaches a position of the mark to be printed on the driving rail 10, the control unit 160 controls the driving unit 110 to stop. In addition, the control unit 160 controls the printing unit 130 to print the mark 30 of the type corresponding to the position of the mark to be printed.

The sensor unit 150 may detect the position and type of the mark 30 printed on the driving rail 10 by the printing unit 130.

The sensor unit 150 may recognize the mark 30 with light or a camera.

In an example embodiment, the sensor unit 150 irradiates light toward the mark 30 and receives a reflected light to detect the position and type of the mark 30.

In another example embodiment, the sensor unit 150 photographs the mark 30 with the camera and detects the position and type of the mark 30 using the photographed image.

Meanwhile, the data processing unit 140 compares the position and type of the mark to be printed with the position and type of the printed mark 30 to detect whether the position and type of the mark to be printed matches the position and type of the printed mark 30.

When the comparison result matches, the data processing unit 140 may generate actual data of the position and type of the driving rail 10 and the printed mark 30. The actual data may include the design information on the driving rail 10, the first information on the position of the mark 30 printed on the driving rail 10, and the first information on the type of the mark 30 printed at each position.

In addition, the data processing unit 140 may transmit the actual data to the server 20 through wireless communication. In the server 20, the actual data may be merged with other actual data transmitted from the other mark printing device 100.

Each of the actual data transmitted from the mark printing devices 100 to the server 20 may be for a partial section of the driving rail 10. By merging the actual data, the actual data may be obtained for an entire section of the driving rail 10.

If the comparison result does not match, the control unit 160 may control the driving unit 110 and the printing unit 130 to re-print the mark 30 on the driving rail 10.

In an example embodiment, when a position of the printed mark 30 does not match with the position of the mark to be printed, printing of the mark 30 may be performed again.

In addition, when the position of the printed mark 30 matches the position of the mark to be printed, but a type of an printed mark 30 does not match the type of the mark to be printed, printing of the mark 30 may be performed again.

Meanwhile, the printer 131 may perform masking printing in which the printed mark 30 is masked before the mark 30 is re-printed so that the printed mark 30 is not recognized.

When the mark 30 is re-printed on the driving rail 10, the sensor unit 150 detects a position and type of the re-printed mark 30, and the data processing unit compares the position and type of the mark to be printed with the position and type of the re-printed mark 30 to detect whether comparison result matches.

When the comparison result does not match, re-printing of the mark 30 using the printing unit 130, detecting the position and type of the re-printed mark 30 using the sensor unit 150, and comparing the position and type of the mark to be printed and the position and type of the re-printed mark 30 using the processing unit 140 may be repeated until the comparison result matches under the control of the controller 160.

The mark printing device 100 may automatically print the mark 30 on the driving rail 10 while the driving unit 110 drives along the driving rail 10. Therefore, the print of the mark 30 may be performed quickly.

Since the encoder unit 120 accurately detects the current position of the driving unit 110 and the driving distance of the driving unit 110 in the driving rail 10, the mark 30 may be accurately printed to the driving rail 10. In particular, when the position and type of the mark to be printed and the position and type of the printed mark 30 does not match, the mark printing device 100 re-prints the mark 30 on the driving rail 10. Therefore, it is possible to increase an accuracy of the position and type of the printed mark 30 printed on the transfer rail 10.

FIG. 5 is a flowchart illustrating a method of printing a mark using the mark printing device shown in FIG. 1.

Referring to FIG. 5, first, design data including design information of the driving rail 10 and first information on a position and type of the mark to be printed on the driving rail 10 are received from the external server 20. (Step 110)

The data processing unit 140 may obtain the design data through wireless communication with the server 20.

Next, the mark 30 is printed on the driving rail 10 by using the design data and second information on the current position and driving distance of the driving unit 110 driving along the driving rail 10. (Step 120)

In an example embodiment, the position and type of the mark to be printed on the driving rail 10 may be detected from the design data acquired by the data processing unit 140. In addition, the second information on the current position and the driving distance of the driving unit 110 may be obtained by detecting the rotation amount of the servo motor provided in the driving unit 110 by using an encoder unit 120. The encoder unit 120 may acquire the second information on the current position and driving distance of the driving unit 110 in real time.

When the driving unit 110 drives along the driving rail 10 and reaches a position of the mark to be printed, the driving unit 110 stops.

When the driving unit 110 stops at the position of the mark to be printed, the printing unit 130 prints the mark 30 of the type corresponding to the position of the mark to be printed.

FIG. 6 is a flowchart illustrating printing mark shown in FIG. 5.

Referring to FIG. 1, a printing process of the mark 30 is as follows.

First, the printer 131 is moved so that the printer 131 for printing the mark 30 is adjacent to the driving rail 10. (Step 121)

In addition, the cover 132 is moved so that the cover 132 is in close contact with the printing surface on which the mark 30 is printed on the driving rail 10. (Step 122)

Since the cover 132 is in close contact with the printing surface of the driving rail 10, the inside of the cover 132 may be sealed.

The movement of the printer 131 and the cover 132 may be performed sequentially or may be performed simultaneously.

Then, the printer 131 prints the mark 30 on the printing surface. (Step 123)

Since the inside of the cover 132 is sealed, particles generated when the printer 131 prints the mark 30 may be suppressed from scattering to the outside of the cover 132. Therefore, it is possible to suppress contamination of the space in which the overhead hoist transport is provided.

When printing of the mark 30 is completed, particles existing the inside of the cover 132 are removed. (Step 124)

In an example embodiment, while circulating the air inside the cover 132 through the passage 135 provided in the cover 132 with the pump 134 mounted on the cover 132, the particles included in the air may be collected by the filter 136 provided in the passage 135.

The pump 134 may operate in a state in which the cover 132 is in close contact with the printing surface of the driving rail 10.

The particles inside the cover 132 may be collected and removed using the pump 134 and the filter 136. Accordingly, even if the cover 132 is spaced apart from the printing surface of the driving rail 10, the space in which the overhead hoist transport is provided may be suppressed from being contaminated by the particles in the inside of the cover 132.

Thereafter, the printer 131 and the cover 132 are spaced apart from the driving rail 10. (Step 125)

The movement of the printer 131 and the cover 132 may be performed sequentially or may be performed simultaneously.

Referring again to FIG. 5, when all the marks 30 are printed on the driving rail 10, the position and type of the marks 30 printed on the driving rail 10 are detected. (Step 130)

In an example embodiment, the sensor unit 150 may detect the position and type of the mark 30.

The sensor unit 150 may recognize the mark 30 by using light or a camera to detect the position and type of the mark 30.

Next, the position and type of the mark to be printed is compared with the position and type of the printed mark 30. (Step 140)

Through the comparison, it is possible to detect whether the position and type of the mark to be printed match with the position and type of the printed mark 30.

If the comparison result matches, the actual data on the driving rail 10 and the position and type of the printed mark 30 are generated. (Step 150)

The actual data may include information on the driving rail 10, information on the position of the mark 30 printed on the driving rail 10, and information on the type of the mark 30 printed at each position.

The actual data is transmitted to the server 20 through wireless communication. (Step 160)

In the server 20, the actual data may be merged with other actual data transmitted from another mark printing device 100.

Each of the actual data transmitted from the mark printing devices 100 to the server 20 may be for a partial section of the driving rail 10. By merging the actual data, the actual data may be obtained for an entire section of the driving rail 10. Accordingly, the actual data can be obtained for all the driving rails 10.

When the comparison result does not match, printing the mark 30 (Step 120), detecting the position and type of the mark 30 printed on the driving rail 10 (Step 130), and comparing the position and type of the mark to be printed with the position and type of the printed mark 30 (Step 140) may be repeated until the comparison result matches.

In the above, printing of the mark 30 may be performed to re-print the mark 30.

In an example embodiment, when the position of the printed mark 30 does not match the position of the mark to be printed, the printing of the mark 30 may be performed again.

In addition, when the position of the printed mark 30 matches the position of the mark to be printed, but the type of the printed mark 30 does not match the type of the mark to be printed, the printing of the mark 30 may be performed again.

Meanwhile, before reprinting the mark 30, masking printing to mask the printed mark 30 may be performed first so that the printed mark 30 is not recognized.

According to the method of printing mark, the mark 30 may be automatically printed on the driving rail 10 while the driving unit 110 drives along the driving rail 10. Therefore, the print of the mark 30 may be performed quickly.

According to the method of printing mark, since the current position of the driving part 110 and the driving distance of the driving part 110 in the driving rail 10 are accurately detected, the mark 30 may be accurately printed to the driving rail 10.

Particularly, when the position and type of the mark to be printed and the position and type of the printed mark 30 does not match, the mark 30 is re-printed on the driving rail 10.

Therefore, it is possible to increase an accuracy of the position and type of the printed mark 30 printed on the transfer rail 10.

Although the stocker has been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A mark printing device comprising;
a driving unit driving along a driving rail of an overhead hoist transport;
a printing unit mounted on the driving unit, the printing unit being configured to print on the driving rail a mark for guiding a motion of a vehicle of driving along the driving rail;
a data processing unit receiving design data including design information of the driving rail and first information on a position and type of the mark to be printed on the driving rail from a server;
an encoder unit being configured to calculate a rotation amount of a servo motor provided in the driving unit to detect a current position of the driving unit and a driving distance of the driving unit in the driving rail; and
a control unit being configured to control the driving unit and the printing unit to print the mark on the driving rail by using the design data and second information on the current position and the driving distance of the driving unit,
wherein the printing unit comprises:
a printer being configured to print the mark on the driving rail; and
a motor being configured to move the printer so that the printer is adjacent to or spaced apart from the driving rail.

2. The mark printing device of claim 1, wherein the printing unit further comprising a cover accommodating the printer and in contact with a printing surface on which the mark is printed on the driving rail to suppress particles from scattering when the printer prints the mark, and the motor further moves the cover so that the cover is in contact with or spaced apart from the driving rail.

3. The mark printing device of claim 2, wherein the printing unit further comprises:
a pump mounted on the cover, the pump circulating air inside the cover through a passage passing through the cover; and
a filter disposed on the passage and collecting the particles contained in the air.

4. The mark printing device of claim 2, wherein the cover includes a portion in contact with the printing surface of the driving rail, the portion of the cover being made of an elastic material.

5. The mark printing device of claim 1, further comprising a sensor unit being configured to detect a position and type of the mark printed on the driving rail by the printing unit.

6. The mark printing device of claim 5, wherein the data processing unit compares the position and type of the mark to be printed with the position and type of the printed mark, and when a comparison result matches, actual data on the driving rail, and the position and type of the print mark are generated.

7. The mark printing device of claim 6, wherein the data processing unit transmits the actual data to the server to merge the actual data with other actual data.

8. The mark printing device of claim 6, wherein when the comparison result does not match, the control unit controls the driving unit and the printing unit to re-print the mark.

9. The mark printing device of claim 5, wherein the types of the marks includes a driving mark, a stopping mark, and a loading/unloading mark.

\* \* \* \* \*